(12) United States Patent
Byquist (10) Patent No.: US 7,121,843 B2
(45) Date of Patent: Oct. 17, 2006

(54) INTEGRATED CIRCUIT SOCKET CORNER RELIEF

(75) Inventor: Tod A. Byquist, Tukwila, WA (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 10/855,054

(22) Filed: May 27, 2004

(65) Prior Publication Data

US 2005/0266604 A1 Dec. 1, 2005

(51) Int. Cl.
H01R 13/62 (2006.01)
(52) U.S. Cl. .......................... 439/73; 439/331
(58) Field of Classification Search ................ 439/73, 439/331, 330, 71, 70, 525, 526
See application file for complete search history.

(56) References Cited

U.S. PATENT DOCUMENTS

| 5,127,837 | A  | 7/1992 | Shah et al. |  |
|---|---|---|---|---|
| 6,086,387 | A  | 7/2000 | Gallagher et al. | 439/71 |
| 6,626,683 | B1 | 9/2003 | Lai | 439/73 |
| 6,692,279 | B1 | 2/2004 | Ma | 439/331 |
| 6,722,909 | B1 | 4/2004 | McHugh et al. | 439/331 |
| 6,752,636 | B1 | 6/2004 | Ma | 439/73 |
| 6,776,642 | B1 | 8/2004 | McHugh et al. | 439/331 |
| 6,780,024 | B1 | 8/2004 | Ma | 439/73 |
| 6,780,025 | B1 | 8/2004 | Ma et al. | 439/73 |

FOREIGN PATENT DOCUMENTS

| EP | 0 398 506 | 11/1990 |
|---|---|---|
| EP | 1 416 780 | 5/2004 |

OTHER PUBLICATIONS

Corbin, J.S. et al. "Land grid array sockets for server applications", IBM J. Res. & Dev. vol. 46, No. 6, Nov. 2002, 0018-8646, © 2002 IBM. Pp. 763-778.
"PCT International Search Report", mailed Aug. 24, 2005, for PCT/US2005/015889.

Primary Examiner—Gary Paumen
(74) Attorney, Agent, or Firm—Buckley, Maschoff & Talwalkar LLC (57) ABSTRACT

In some embodiments, a system includes a socket having a first set of socket contacts exposed on a first side of the socket and a second set of socket contacts exposed on a second side of the socket; and a frame comprising at least one surface to engage two lower surfaces of the second side of the socket. The two lower surfaces may be coupled by a lower corner surface of the second side of the socket, and wherein the lower corner surface does not engage the frame.

22 Claims, 7 Drawing Sheets

INTEGRATED CIRCUIT SOCKET CORNER RELIEF

BACKGROUND

An integrated circuit (IC) package is used to electrically couple an IC die to external components and circuitry. Conventionally, electrical contacts of an IC die are coupled to electrical contacts of an IC package, which are in turn electrically connected to external contacts of the IC package. The external contacts of the IC package may comprise pins, solder balls or other types of contacts arranged in any suitable pattern.

The external contacts of an IC package may be mounted directly to electrical contacts of a substrate such as a motherboard. Alternatively, sockets have been devised to removably attach an IC package to electrical contacts of a substrate. For example, electrical contacts of an IC package may be removably coupled to first contacts of a socket, and second contacts of the socket may be coupled to a substrate.

In order to ensure a good electrical connection between package and socket contacts, some architectures require the application of a force to bias contacts of the socket against corresponding contacts of the package. This force may result in potentially damaging tension loads on the IC package, the socket, the package/socket interface, and/or the socket/substrate interface.

DETAILED DESCRIPTION

Figure 1:
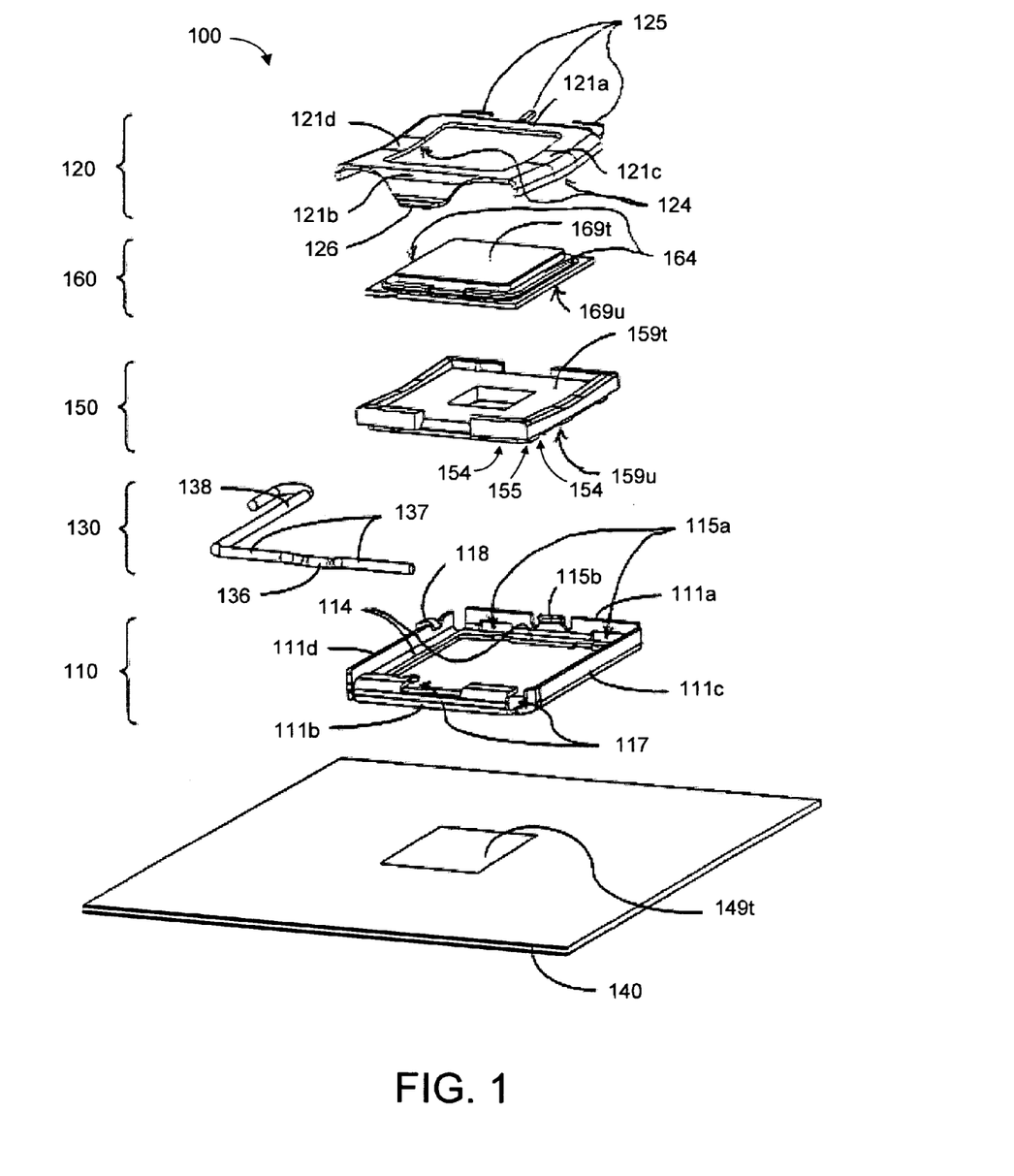
FIG. 1 is an exploded view of a system according to some embodiments.

FIG. 1 is an exploded view of a system according to some embodiments. System 100 comprises frame 110, load plate 120, load lever 130, socket 150 and IC package 160. Frame 110, load plate 120 and load lever 130 may cooperate to press socket contacts on topside 159*t* of socket 150 against contacts on underside 169*u* of IC package 160.

Socket 150 may comprise any suitable material, including but not limited to a plastic material. Socket 150 may comprise a first set of socket contacts (not shown in FIG. 1) exposed on topside 159*t* in a Land Grid Array (LGA) arrangement. The first set of socket contacts may comprise compression-type contacts such as a metal spring. Socket 150 may also comprise a second set of socket contacts (also not shown in FIG. 1) disposed on underside 159*t*. At least a subset of the first set of socket contacts is electrically connected to respective ones of a subset of the second set of contacts. The second set of socket contacts may comprise any contacts suitable for connection to circuit board 140, including but not limited to solder balls and/or socket pins in an LGA arrangement.

In some embodiments, frame 110 is fabricated from a single piece of sheet metal. However, embodiments are possible in which frame 110 is formed of cast metal, composite, ceramic, plastic, etc. Frame 110 includes surfaces 114 to engage lower surfaces 154 of socket 150. As will be described in detail below, lower surfaces 154 are coupled to one another by lower corner surface 155 of underside 159*u*, and lower corner surface 155 does not engage frame 110 when system 100 is assembled. In some embodiments, lower corner surface 155 defines a plane that is different from a second plane defined by lower surfaces 154.

Elements of system 100 may be interconnected as follows. Load lever 130 is pivotally coupled within lever channel 117 formed in frame portion 111*b* of frame 110, and load point 136 of lever 130 is aligned to protrude through load point channel 116 formed through portion 111*b* of frame 10. Socket 150 is then positioned within the area outlined by frame portions 111*a* through 111*d*, and lower surfaces 154 of socket 150 are positioned to engage surfaces 114 of frame 110.

IC package 160, which may comprise a microprocessor, is positioned between load plate 120 and socket 150, aligning contacts on underside 169*u* of IC package 160 with corresponding socket contacts on topside 159*t* of socket 150, and aligning raised topside 169*t* of IC package 160 with the opening defined by plate portions 121*a* through 121*d*. Load plate 120 and IC package 160 are also aligned to allow load plate surfaces 124 on plate portions 121*c* and 121*d* of load plate 120 to engage load points 164 surrounding raised topside 169*t* of IC package 160. Raised topside 169*t* is raised relative to load points 164 such that raised topside 169*t* protrudes through the opening formed through load plate 120 when load plate surfaces 124 and load points 164 are engaged with each other.

In some embodiments, electrical circuitry is integrated with a die disposed within IC package 160 at a location generally centered behind raised topside 169*t*, and the placement of load points 164 at locations surrounding raised topside 169*t* may prevent the application of force exerted by load plate 120 against topside 169*t* (which may be more fragile than load points 164), thereby avoiding the possibility of damaging the circuitry of IC package 160. The protrusion of topside 169*t* through the opening formed through load plate 120 may allows a heatsink or other cooling device to be positioned in contact with topside 169*t* such that heat generated by circuitry within IC package 160 may be conducted away through topside 169*t*.

Load plate 120 is pivotally coupled to frame 110, in part, via hinge tabs 125 on plate portion 121*a* of load plate 120. Hinge tabs 125 engage hinge channels 115*a* and hinge tab 115*b* provided by frame portion 11*a* of frame 110. Load plate 120 pivots around hinge channels 115*a* to press IC 160 against socket 150. Such pressure may press contacts disposed on underside 169*u* of IC package 160 against socket contacts disposed on topside 159*t* of socket 150.

In some embodiments, at least hinge tabs 125 and/or load point 126 of load plate 120 may be fabricated of spring metal or any of a variety of other materials providing similar flexibility. Plate portions 121*c* and 121*d* provide load points 124 to engage corresponding load points 164 of IC package 160. Plate portions 121*c*–*d* may also or alternatively be fabricated from spring metal or any of a variety of materials providing similar flexibility. In some embodiments, plate portions 121*c* and 121*d* are curved such that load points 124 are each at the outward-most bow of the curve of each of plate portions 121*c* and 121*d* and such that load points 164 occupy a minimal amount of surface area. In some embodiments, load points 124 comprise dimples or other form of protrusion formed in or carried by each of plate portions 121c–d such that IC package 160 is engaged by load points 124 only at minimal specific locations.

Load lever 130 is pivoted about the common axis of axle portions 137, causing load point 136 of load lever 130 to engage load point 126 on plate portion 121b of load plate 120 and so that lever handle 138 engages lever catch 118 of frame 110. The engagements between hinge lip 125 and hinge channel 115, between load point 136 and load point 126, between lower surfaces 154 and surfaces 114, and between load plate surfaces 124 and load points 164 cooperate to exert forces normal to both underside 169u of IC 160 and topside 159t that press underside 169u against topside 159t such that contacts on both underside 169u and topside 159t are pressed into engagement with each other, forming electrical connections therebetween.

Socket 150 attaches to circuit board 140 via any of a number of known techniques for coupling socket contacts on underside 159u of socket 150 to contacts on socket surface location 149t of circuit board 140. Such attachment creates an electrical connection between circuit board 140 and integrated circuitry of IC package 160.

Figure 2:
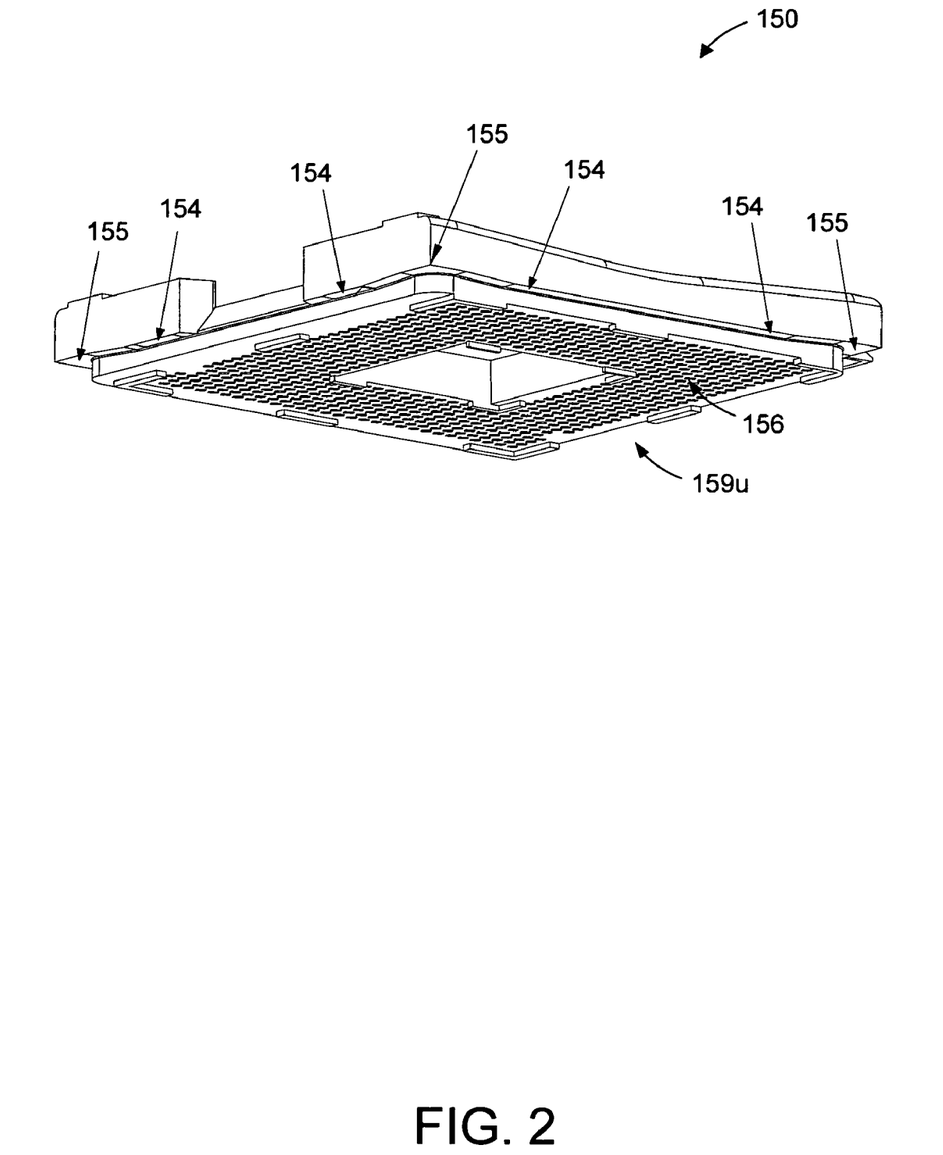
FIG. 2 is a perspective view of an apparatus according to some embodiments.

FIG. 2 is a perspective view of socket 150 according to some embodiments. As shown, lower surfaces 154 of socket 150 are coupled to one another by lower corner surface 155 of underside 159u, and lower corner surface 155 defines a plane that is different from a second plane defined by lower surfaces 154. As a result, lower corner surface 155 does not engage frame 110 when system 100 is assembled according to some embodiments. FIG. 2 also shows socket contacts 156 which are to engage contacts carried by a circuit board in some embodiments.

Figure 3:
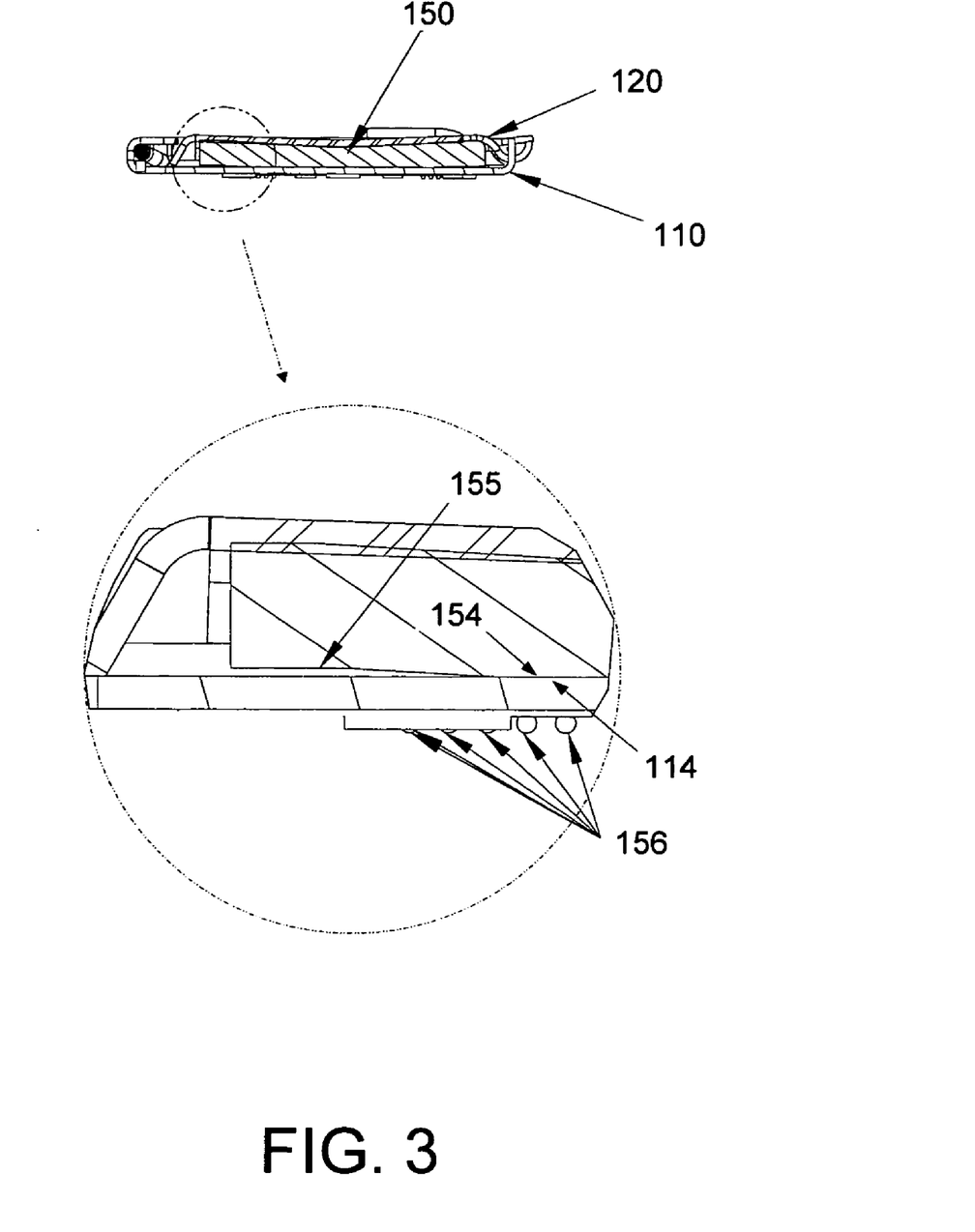
FIG. 3 is a cross-sectional diagram of an apparatus according to some embodiments.

FIG. 3 comprises a cross-sectional diagram and a magnified cross-sectional view of frame 110, load plate 120, and socket 150 according to some embodiments. Load plate 120 has pivoted around hinge channels 115a to press IC package 160 (not shown) against socket 150. The engagements between hinge lip 125 and hinge channel 115, between load point 136 and load point 126, between lower surfaces 154 and surfaces 114, and between load plate surfaces 124 and load points 164 cooperate to exert forces normal to both underside 169u of IC 160 and topside 159t that press underside 169u against topside 159t such that contacts on both underside 169u and topside 159t are pressed into engagement with each other, forming electrical connections therebetween.

As shown in the magnified view, lower corner surface 155 does not engage frame 110 when surface 114 of frame 110 engages lower surface 154 of socket 150. Lower corner surface 155 may also define a plane that is different from a second plane defined by lower surface 154. Some embodiments of such an arrangement may provide better distribution of a tension load among contacts 156 than other arrangements. More particularly, load plate 120 and frame 110 may create a bending load on socket 150 when assembled as shown in FIG. 3. The bending load may generate tension loads on socket contacts 156 when socket contacts 156 are attached to a substrate.

Figure 4:
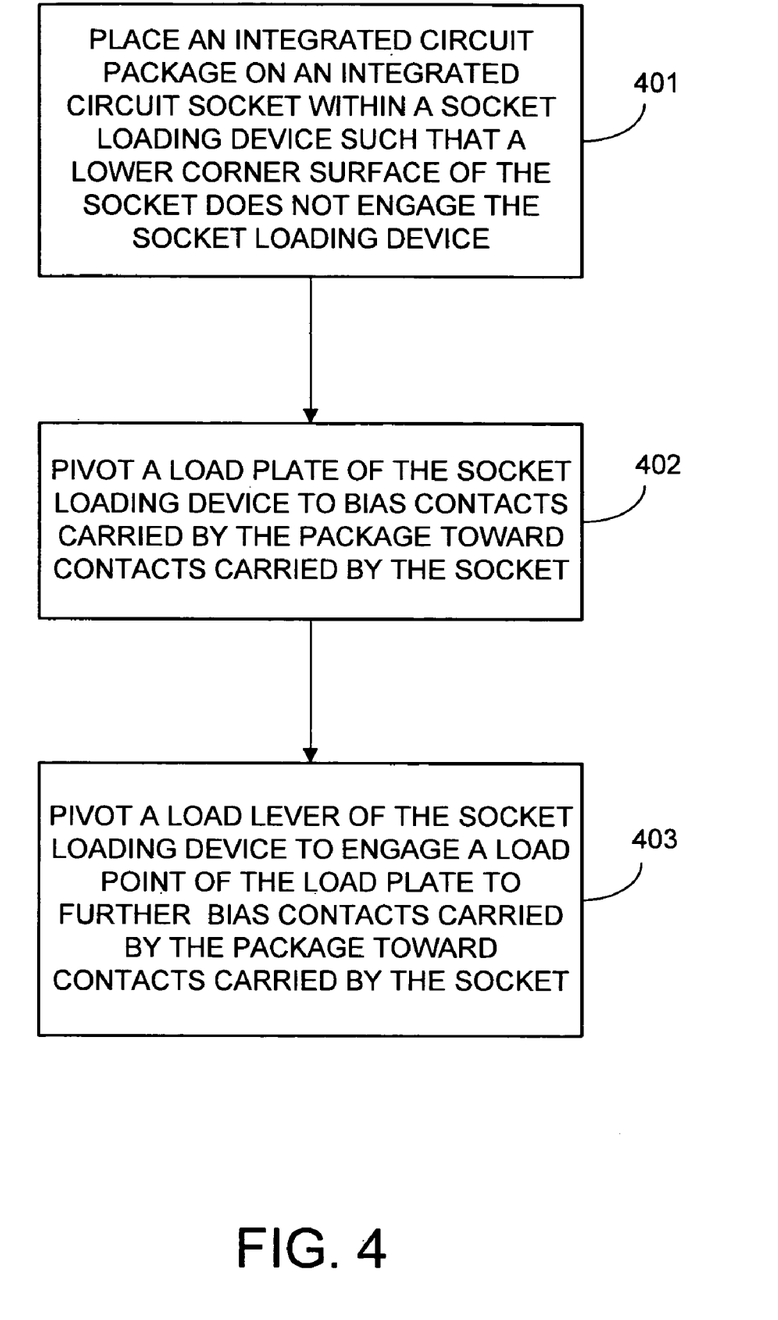
FIG. 4 is a flow diagram according to some embodiments.

FIG. 4 is a flow diagram of a process according to some embodiments. The process may be performed by any combination of automated, machine-assisted and/or manual means.

Prior to 401, an integrated circuit socket is positioned within a socket loading device such that a lower corner surface of the socket does not engage the socket loading device. According to some embodiments, socket 150 is positioned within the area outlined by frame portions 111a through 111d of frame 110, and lower surfaces 154 of socket 150 are placed into engagement with surfaces 114 of frame 110. A lower corner surface such as surface 155 may couple the lower surfaces 154 at one or more corners of socket 150. The lower corner surface may define a plane that is different from a second plane defined by lower surfaces 154.

Next, socket contacts carried by socket 150 are attached to contacts carried by a circuit board to form a plurality of interconnections therebetween. The attachment may comprise any currently- or hereafter-known system to attach socket contacts to circuit board contacts. In some embodiments, this process is performed at a first factory. The circuit board, socket, and frame may then be shipped to another factory for execution of the FIG. 4 process.

Initially, an IC package is placed on the socket at 401. A lower corner surface of the socket does not engage the socket loading device after 401. Electrical contacts of IC package 160 may be aligned with corresponding socket contacts of the socket 150 at 401 to prepare for pressing together of the contacts. Next, at 402, a load plate of the socket loading device is pivoted to bias contacts carried by the IC package toward contacts carried by the socket.

Figure 5A:
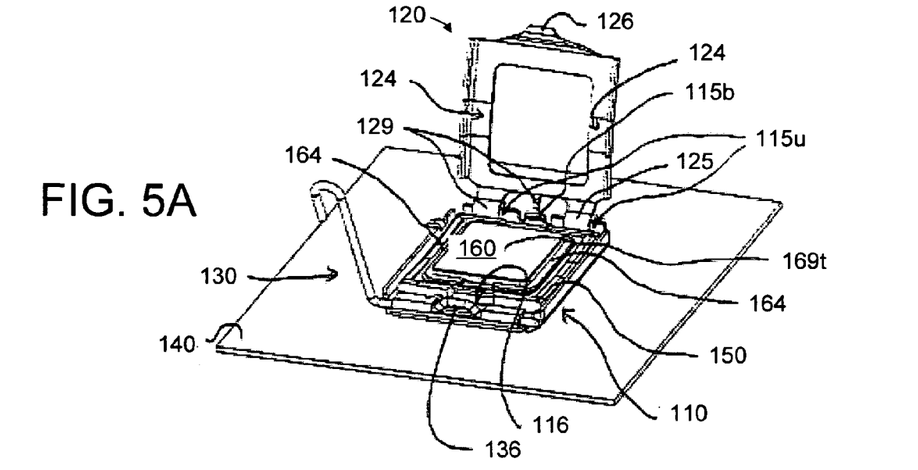
FIGS. 5A, 5B and 5C depict installation of an IC package in a socket according to some embodiments.

FIG. 5A illustrates system 100 prior to 402 according to some embodiments. Load lever 130 is shown already positioned within lever channel 117 formed within frame 110. Load plate 120 has been positioned such that hinge tabs 125 have engaged hinge channels 115a and hinge tab 115b provided by frame 110, thereby creating a hinge between load plate 120 and frame 110 that allows load plate 120 to pivot relative to frame 110.

Figure 5B:
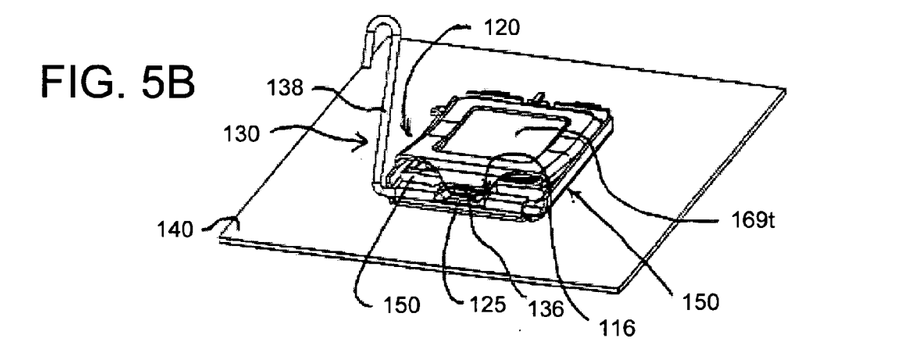

Therefore, during 402, raised topside 169t of IC package 160 is aligned with the opening defined by load plate 120. Load plate 120 and IC package 160 are also aligned to allow load plate surfaces 124 to engage load points 164 surrounding raised topside 169t of IC package 160. Load plate 120 is then pivoted towards frame 110 such that load plate surfaces 124 engage load points 164 of IC package 160 to bias contacts carried by IC package 160 toward corresponding contacts carried by socket 150. FIG. 5B shows system 100 after completion of the pivot at 402. According to some embodiments, lower corner surface 155 of socket 150 does not engage frame 110 after 402.

Figure 5C:
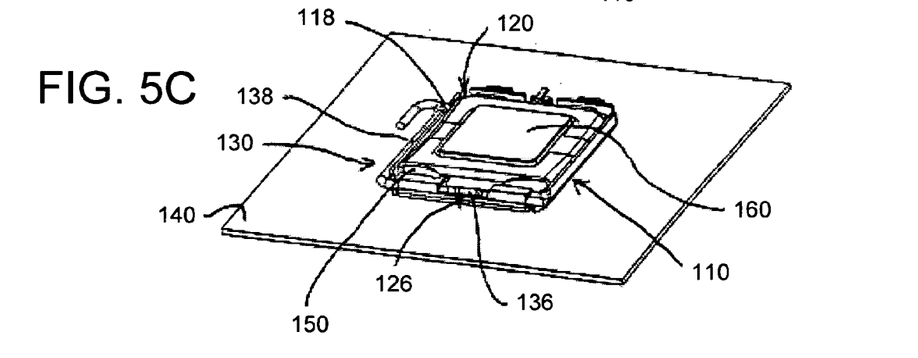

At 403, a load lever of the socket loading device is pivoted to engage a load point of the load plate to further bias contacts carried by the IC package toward corresponding contacts carried by the socket. As shown in FIG. 5B, load point 126 has entered load point channel 116 prior to 403. In some embodiments of 403, therefore, load lever 130 is pivoted by pivoting of lever handle 138 towards circuit board 140 such that load point 136 engages load point 126 and such that lever handle 138 engages lever catch 118. Lever catch 118 aids in holding load lever 130 in place, thereby aiding in the maintenance of force through load point 136 to press load point 126 into load point channel 116 so as to further bias contacts carried by IC package 160 toward corresponding contacts carried by socket 150. FIG. 5C illustrates system 100 after 403 according to some embodiments. Lower corner surface 155 of socket 150 continues to remain apart from engage frame 110 after some embodiments of 403.

The contacts of socket 150 that engage the contacts of IC package 160 are now electrically connected with the contacts of socket 150 that engage the contacts of circuit board 140, thereby forming electrical connections between the contacts of IC package 160 and circuit board 140 through socket 150. According to some embodiments, system 100 is attached to circuit board 140 using mechanical fastening in addition to that described above.

Figure 6:
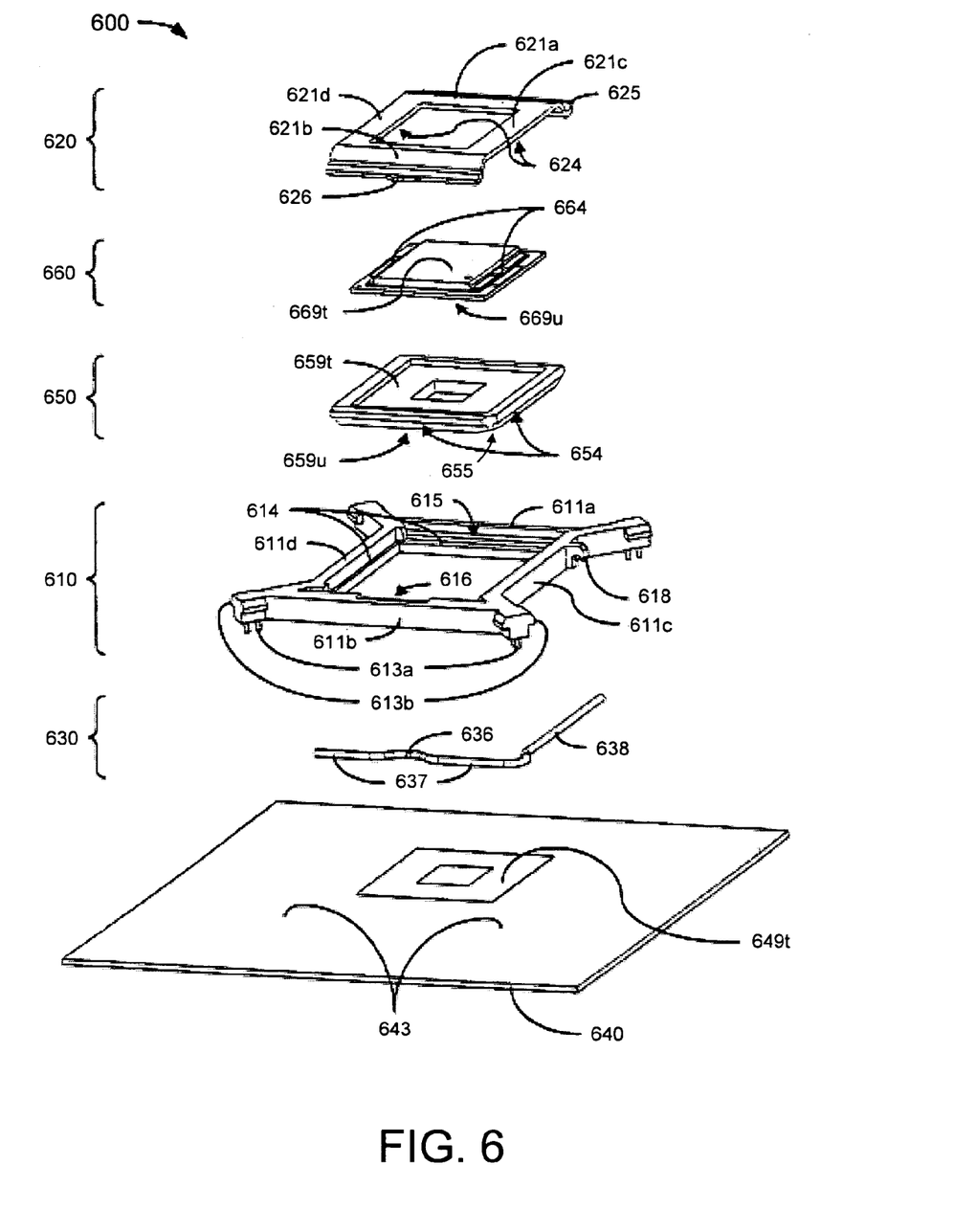
FIG. 6 is an exploded view of a system according to some embodiments.

FIG. 6 is an exploded view of a system according to some embodiments. System 600 comprises frame 610, load plate 620, load lever 630, socket 650 and IC package 660. Frame 610, load plate 620 and load lever 630 may cooperate to press socket contacts on topside 659t of socket 650 against contacts on underside 669u of IC package 660.

Load lever 630 is positioned between frame 610 and circuit board 640, aligning axle portions 637 of load lever 630 with a load lever channel (not shown) formed in frame portion 611b of frame 610, and aligning load point 636 of lever 630 to protrude through load point channel 616 formed through portion 611b. Frame 610 attaches to circuit board 640 via fasteners 613a and mounting holes 643 of circuit board 640. The load lever channel of frame 610 traps load lever 630 within and between frame 610 and circuit board 640. According to some embodiments, frame 610 is not attached to circuit board 640 via fasteners 613a and mounting holes 643. Rather, frame 610 is held against circuit board 640 by virtue of a connection between socket 650 and circuit board 640.

Socket 650 may attach to circuit board 640 via any of a number of known techniques for soldering socket contacts on underside 659u of socket 650 to contacts on socket surface location 649t of circuit board 640. As socket 650 is attached to circuit board 640, socket 650 is positioned amidst the open area formed through the middle of frame 610 that is outlined by frame portions 611a through 611d, and lower surfaces 654 of socket 650 engage surfaces 614 of frame 610.

Lower surfaces 654 are coupled to one another by lower corner surface 655 of underside 659u, and lower corner surface 655 does not engage frame 610 when system 100 is assembled. In some embodiments, lower corner surface 655 defines a plane that is different from a second plane defined by lower surfaces 654.

IC package 660, which may comprise a microprocessor, is positioned between load plate 620 and socket 650, aligning contacts on underside 669u of IC package 660 with corresponding socket contacts on topside 659t of socket 650, and aligning raised topside 669t of IC package 660 with the opening defined by plate portions 621a through 621d. Load plate 620 and IC package 660 are also aligned to allow load plate surfaces 624 on plate portions 621c and 621d of load plate 620 to engage load points 664 surrounding raised topside 669t of IC package 660. Raised topside 669t is raised relative to load points 664 such that raised topside 669t protrudes through the opening formed through load plate 620 when load plate surfaces 624 and load points 664 are engaged with each other.

In some embodiments, electrical circuitry is integrated with a die disposed within IC package 660 at a location generally centered behind raised topside 669t, and the placement of load points 664 at locations surrounding raised topside 669t may prevent the application of force exerted by load plate 620 against topside 669t (which may be more fragile than load points 664), thereby avoiding the possibility of damaging the circuitry of IC package 660. The protrusion of topside 669t through the opening formed through load plate 620 may allows a heatsink or other cooling device to be positioned in contact with topside 669t such that heat generated by circuitry within IC package 660 may be conducted away through topside 669t.

Load plate 620 is pivotally coupled to frame 610, in part, via hinge lip 625 on plate portion 621a. Hinge lip 625 engages hinge channel 615 formed in frame portion 611a of frame 610. Load plate 120 pivots around hinge channel 615 to press IC package 660 against socket 650. Such pressure may press contacts disposed on underside 669u of IC package 660 against socket contacts disposed on topside 659t of socket 650. According to some embodiments, at least plate portions 621c and 621d are generally of one plane such that load points 624 are each generally made up of an entire surface of each of plate portions 621c and 621d. All four of plate portions 621a through 621d may form a common plane, and therefore, load points 624 may be generally made up of a common surface extending all about all four of plate portions 621a–d such that IC package 160 is engaged at load points in a rectangular layout generally following the rectangular shape formed by plate portions 621a–d.

Load lever 630 is pivoted about the common axis of axle portions 637, causing load point 636 of load lever 630 to engage load point 626 on plate portion 621b of load plate 620 and so that lever handle 638 engages lever catch 618 of frame 610. The engagements between hinge lip 625 and hinge channel 615, between load point 636 and load point 626, between lower surfaces 654 and surfaces 614, and between load plate surfaces 624 and load points 664 cooperate to exert forces normal to both underside 169u of IC 160 and topside 659t that press underside 669u against topside 659t such that contacts on both underside 669u and topside 659t are pressed into engagement with each other, forming electrical connections therebetween.

In some embodiments, frame 610 may be designed with a physical stop in the vicinity of load point channel 616 to limit the degree to which load plate 620 may be pressed towards socket 650, and thereby limit the force exerted by load plate 620 at load points 624 against IC package 660 at load points 664 in order to protect against inadvertent damage to IC package 660. In some embodiments, load lever 630 may be fabricated in such a way that there is sufficient flexibility in the material of load lever 630 such that load point 636 may flex to some limited degree relative to load handle 638 on the common axis of axle portions 637 in order to provide some wider tolerances to accommodate instances where load point 636 engages load point 626 and has effectively already pressed load plate 620 as far as load plate 620 either could or should go before load handle 638 has yet engaged lever catch 618.

Figure 7:
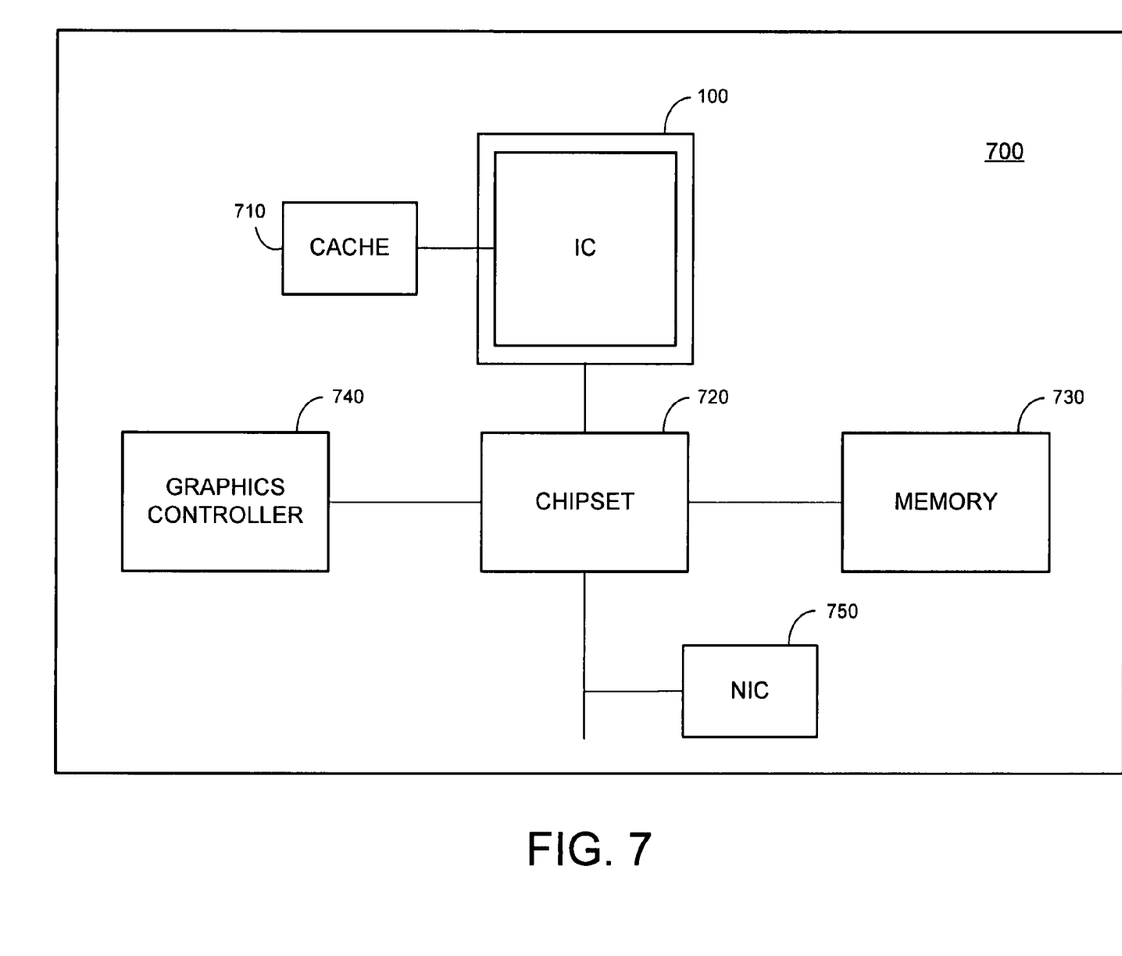
FIG. 7 is a block diagram of a system according to some embodiments.

FIG. 7 is a block diagram of system 700 according to some embodiments. System 700 may comprise components of a desktop computing platform. System 700 includes system 100 of FIG. 1 and therefore includes an IC package within system 100. The IC package, which may comprise a microprocessor or another type of integrated circuit, may communicate with off-die cache 710. The IC package may also communicate with other elements via chipset 720. For example, chipset 720 may provide communication between the IC package and memory 730, graphics controller 740, and Network Interface Controller (NIC) 750. Memory 730 may comprise any type of memory for storing data, such as a Single Data Rate Random Access Memory, a Double Data Rate Random Access Memory, or a Programmable Read Only Memory.

The several embodiments described herein are solely for the purpose of illustration. Some embodiments may include any currently or hereafter-known versions of the elements described herein. Therefore, persons in the art will recognize from this description that other embodiments may be practiced with various modifications and alterations. For example, although embodiments have been discussed in reference to the mounting of an IC package to a circuit board through a socket, various components/devices other than an IC package may be mounted to various surfaces other than a circuit board by way of some embodiments. Also, although embodiments are discussed with reference to an IC package with LGA contacts, embodiments may employ other types of contacts.

What is claimed is:

1. A socket to couple an integrated circuit package to a substrate, comprising:

a first set of socket contacts exposed on a first side of the socket, the first set of socket contacts to engage contacts of the integrated circuit package; and a second set of socket contacts exposed on a second side of the socket, the second side of the socket including two lower surfaces to engage a socket loading device, the two lower surfaces coupled by a lower corner surface of the socket, and the lower corner surface defining a first plane that is different from a second plane defined by at least one of the two lower surfaces so that the lower corner surface does not engage the socket loading device.

2. A socket according to claim 1, wherein at least a subset of the first set of socket contacts is electrically connected to respective ones of a subset of the second set of socket contacts, wherein the substrate comprises a circuit board, and wherein the second set of contacts is to engage contacts carried by the circuit board.

3. A socket according to claim 1, wherein the contacts of the integrated circuit package comprise land grid array contacts.

4. A socket according to claim 3, wherein the second set of socket contacts comprises solder balls.

5. A socket according to claim 3, wherein the second set of socket contacts comprises socket pins.

6. A system comprising:
a socket comprising a first set of socket contacts exposed on a first side of the socket, the first set of socket contacts to engage contacts of an integrated circuit package, and a second set of socket contacts exposed on a second side of the socket; and
a frame comprising at least one surface to engage two lower surfaces of the second side of the socket;
wherein the two lower surfaces are coupled by a lower corner surface of the second side of the socket, the lower corner surface defining a first plane that is different from a second plane defined by at least one of the two lower surfaces, and wherein the lower corner surface does not engage the frame.

7. A system according to claim 6, further comprising:
a load plate pivotally coupled to the frame and having a load plate surface to engage an integrated circuit package disposed in the frame so as to press contacts of the integrated circuit package against the first set of socket contacts to create electrical connections therebetween.

8. A system according to claim 7, a load lever pivotally coupled to the frame, the load lever to retain and press the load plate towards the frame.

9. A system according to claim 6, wherein at least a subset of the first set of socket contacts is electrically connected to respective ones of a subset of the second set of socket contacts, wherein the substrate comprises a circuit board, and wherein the second set of contacts is to engage contacts carried by the circuit board.

10. A system according to claim 9, wherein the frame is not directly connected to the circuit board.

11. A system according to claim 6, wherein the contacts of the integrated circuit package comprise land grid array contacts.

12. A system according to claim 11, wherein the second set of socket contacts comprises solder balls.

13. A system according to claim 11, wherein the second set of socket contacts comprises socket pins.

14. A method comprising:
positioning an integrated circuit socket within a socket loading device such that two lower surfaces of the socket engage the socket loading device, and such that a lower corner surface of the socket that couples the two lower surfaces, does not engage the socket loading device, the lower corner surface defining a first plane that is different from a second plane defined by at least one of the two lower surfaces.

15. A method according to claim 14, further comprising:
placing an integrated circuit package on the socket such that contacts carried by the package are aligned for engagement with a first set of contacts carried by the socket; and
pivoting a load plate of the socket loading device such that at least a portion of the load plate engages at least a portion of the package and biases the contacts carried by the package toward the first set of contacts carried by the socket.

16. A method according to claim 15, further comprising:
pivoting a load lever of the socket loading device such that at least one load point of the load lever engages at least one load point of the load plate and further pivots the load plate to further bias the contacts carried by the package toward the first set of contacts carried by the socket.

17. A method according to claim 15, wherein the lower corner surface of the socket does not engage the socket loading device before, during, or after the pivoting of the load plate.

18. A method according to claim 14, further comprising:
attaching a first set of contacts carried by the socket to a set of contacts carried by a circuit board to form a plurality of electrical connections therebetween.

19. A system comprising:
an integrated circuit package comprising electrical contacts;
a socket comprising a first set of socket contacts exposed on a first side of the socket, the first set of contacts electrically coupled to the electrical contacts of the package, and a second set of socket contacts exposed on a second side of the socket;
a frame comprising at least one surface to engage two lower surfaces of the second side of the socket; and
a double data rate memory electrically coupled to the integrated circuit package;
wherein the two lower surfaces are coupled by a lower corner surface of the second side of the socket, the lower corner surface defining a first plane that is different from a second plane defined by at least one of the two lower surfaces, and wherein the lower corner surface does not engage the frame.

20. A system according to claim 19, further comprising:
a load plate pivotally coupled to the frame and having a load plate surface to engage the integrated circuit package so as to press contacts of the integrated circuit package against the first set of socket contacts to create electrical connections therebetween.

21. A system according to claim 19, further comprising:
a circuit board electrically coupled to the second set of socket contacts and to the memory.

22. A system according to claim 20, wherein the circuit board electrically coupled to the second set of socket contacts and to the memory.

* * * * *